United States Patent [19]
Hardee et al.

[11] Patent Number: 5,483,152
[45] Date of Patent: Jan. 9, 1996

[54] WIDE RANGE POWER SUPPLY FOR INTEGRATED CIRCUITS

[75] Inventors: Kim C. Hardee; Michael V. Cordoba, both of Colorado Springs, Colo.

[73] Assignees: United Memories, Inc., Colorado Springs, Colo.; Nippon Steel Semiconductor Corp., Chiba, Japan

[21] Appl. No.: 3,450

[22] Filed: Jan. 12, 1993

[51] Int. Cl.⁶ ........................................ G05F 3/16
[52] U.S. Cl. ............................. 323/314; 327/534
[58] Field of Search ........................ 323/312–317; 327/530, 534, 543

[56] References Cited

U.S. PATENT DOCUMENTS

| | | | |
|---|---|---|---|
| 4,191,923 | 3/1980 | Schelisch | 325/4 |
| 4,259,715 | 3/1981 | Morokawa | 363/60 |
| 4,482,985 | 1/1984 | Itoh et al. | 365/226 |
| 4,584,517 | 4/1986 | Schwob | 323/222 |
| 4,967,138 | 10/1990 | Obergfell et al. | 323/224 |
| 4,985,671 | 1/1991 | Sauer | 323/282 |
| 4,994,688 | 2/1991 | Horiguchi et al. | 307/296.8 |
| 5,304,859 | 4/1994 | Arimoto | 307/296.2 |

FOREIGN PATENT DOCUMENTS

| | | |
|---|---|---|
| 3923632A1 | 11/1990 | Germany . |
| 4115082A1 | 11/1991 | Germany . |
| 2248357 | 1/1992 | United Kingdom . |

OTHER PUBLICATIONS

Noda et al,, "A Boosted Dual Word–line Decoding Scheme For 256 Mb DRAMs" Symposium on VLSI Circuits, Digest of Technical Papers, (1992).

Primary Examiner—Peter S. Wong
Assistant Examiner—Adolf Berhane
Attorney, Agent, or Firm—Edward D. Manzo; John J. King

[57] ABSTRACT

A wide range power supply for integrated circuits includes a voltage-down converter to receive the input supply voltage and generate a controlled low voltage signal. The circuit also includes a voltage-up converter which receives the controlled low voltage signal to generate a high voltage signal for high power circuits. Finally, a substrate bias generator is employed in the circuit to generate a substrate bias signal. Because the low power voltage is controlled, the high power voltage and the substrate bias signal are independent of any variations in input supply voltage. In alternate embodiments, the voltage-up converter or voltage-down converter can be disabled if the external supply voltage is controlled and maintained in at high or low voltage respectfully.

27 Claims, 4 Drawing Sheets

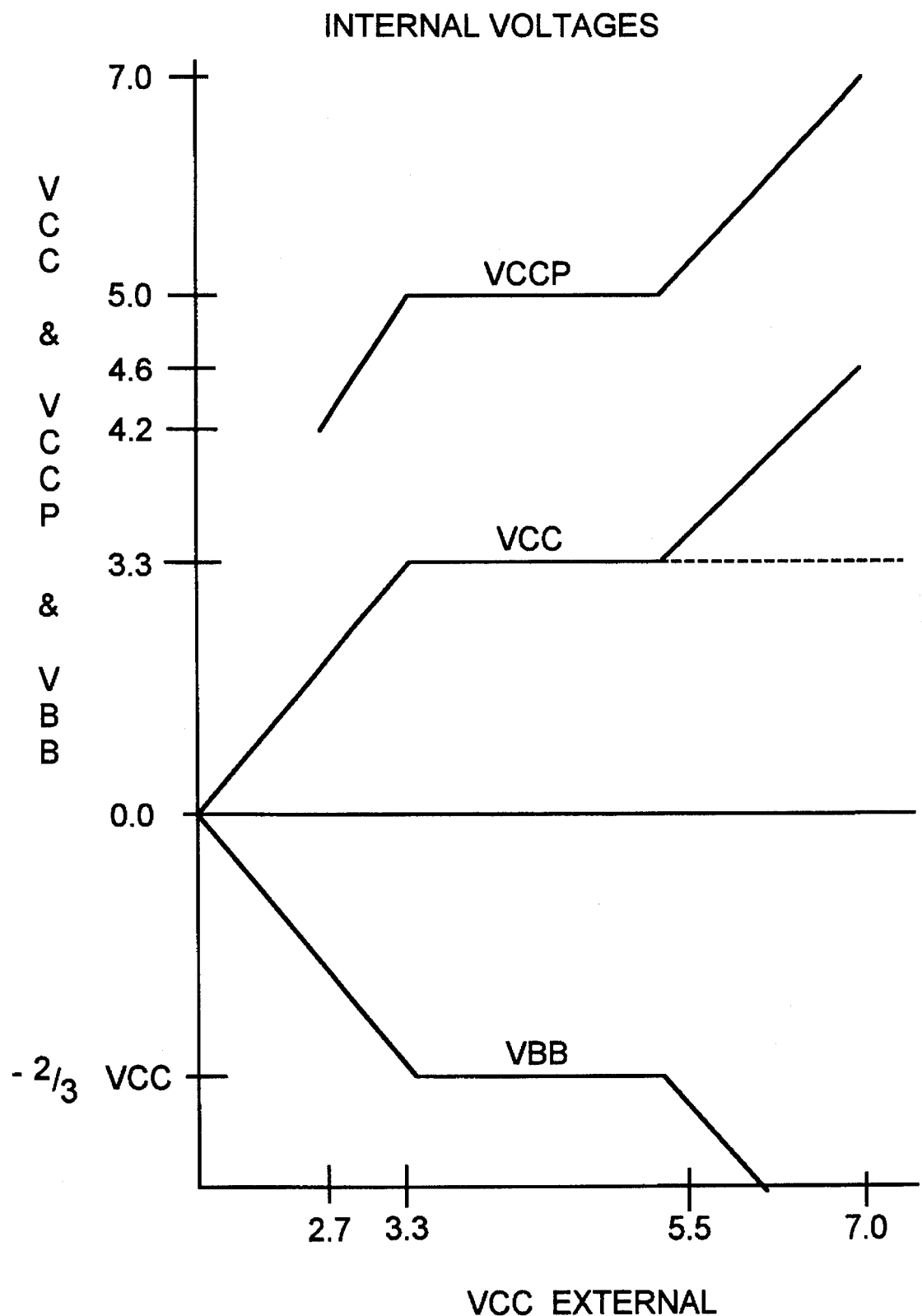

WIDE RANGE POWER SUPPLY FOR INTEGRATED CIRCUITS

FIELD OF THE INVENTION

This invention relates to a power supply for an integrated circuit and more particularly to a power supply circuit for receiving a voltage within a wide range of external voltages and generating or providing plural (non-zero) internal voltages over a wide range.

DESCRIPTION OF THE PRIOR ART

Integrated circuits include a number of input pins. One pin is for a power supply voltage, often called VCC, and another is for ground, also called VSS, which is generally 0 volts. There is very strong resistance to adding any additional voltage supply pin. However, some circuits call for different internal voltages. These voltages must be generated internally.

Previously, integrated circuits generating such different internal voltages would operate within a very narrow input power supply range. For example, a 3.3 volt device may operate on an input power supply range of 3.0 volts to 3.6 volts, and a 5 volt device may operate in the range of 4.5 to 5.5 volts. Generally, these integrated circuits are designed for either a 3.3 volt input or a 5 volt input. If a device designed to receive a 3.3 volt input were operated at 5 volts, it would consume too much power and would not be reliable. Conversely, if a device designed to receive a 5 volt input were supplied with only 3.3 volts, it would either be very slow or not work at all.

An object of a present invention is to provide a power supply for use within integrated circuits which is able to operate within such a wide range of input voltages, to generate separate voltages to drive low voltage circuits and high voltage circuits, and to maintain the potential at the substrate of an integrated circuit.

Another object of the present invention is to provide a power supply for integrated circuits which operates on a low input voltage which is coupled to low voltage circuits and which generates a voltage to drive high voltage circuits and a voltage to maintain the potential at the substrate of an integrated circuit.

Another object of the present invention is to provide a power supply for integrated circuits which operates on a high input voltage which is coupled to high voltage circuits and which generates a voltage to drive low voltage circuits and a voltage to maintain the potential at the substrate of an integrated circuit.

SUMMARY OF THE INVENTION

The wide range power supply for integrated circuits according to a preferred form of the present invention can operate within a wide range of input supply voltages to provide: (a) a low voltage internal supply signal, (b) a high voltage internal supply signal, and (c) a substrate bias signal. Specifically, the preferred embodiment includes a voltage-down converter to receive the input supply voltage and generate a controlled low voltage signal. Because the low voltage signal is controlled, this signal can be used within the circuit to drive circuits or generate other signals which are independent of variations in the input supply voltage.

The preferred circuit also includes a voltage-up converter which receives the controlled low voltage signal to generate a high voltage signal for high voltage circuits. Finally, the preferred circuit includes a substrate bias generator which generates a substrate voltage signal to maintain the potential at the substrate of the semiconductor device. Because the low voltage signal is controlled, the high voltage and the substrate voltage signals are independent of variations in the input supply voltage. Although the circuit of the present invention could be used with any integrated circuit, the circuit is particularly useful for DRAMS and other memory devices.

In an alternate embodiment, the input supply voltage is generally low (for example, 3.3 volts) and is controlled. Therefore, the input supply voltage is used to drive low voltage circuits, and no voltage-down converter is required. The alternate embodiment, however, includes a voltage-up converter to generate a high voltage and a substrate bias generator for maintaining the substrate voltage.

Finally, another alternate embodiment for receiving a high voltage input supply is disclosed. This embodiment is employed when the input supply voltage is high (for example, 5 volts) and is controlled. Therefore, the input supply voltage is used to power the high voltage circuits, eliminating the need for a voltage-up converter. This embodiment, however, includes a voltage-down converter for generating a low voltage and a substrate bias generator for maintaining the substrate voltage.

BRIEF DESCRIPTION OF THE DRAWINGS

In describing the present invention, reference is made to the accompanying drawings, wherein:

FIG. 4 is a plot of the VCC, VCCP and VBB voltages as a function of the input supply voltage.

BRIEF DESCRIPTION OF APPENDICES

The appendices hereto form part of the present disclosure and are incorporated by reference. Appendix A is a copy of U.S. patent application Ser. No. 07/991,533, filed Dec. 14, 1992 (attorney ref. no. UM-115), which is commonly assigned to the assignees of the present invention. The text of Appendix A, which is included as a part the original disclosure of the present application, discloses the preferred voltage-down converter 24 shown in the block diagram of FIG. 1 and FIG. 3.

Application Ser. No. 07/991,533 has been allowed but not yet issued.

Figure 1:
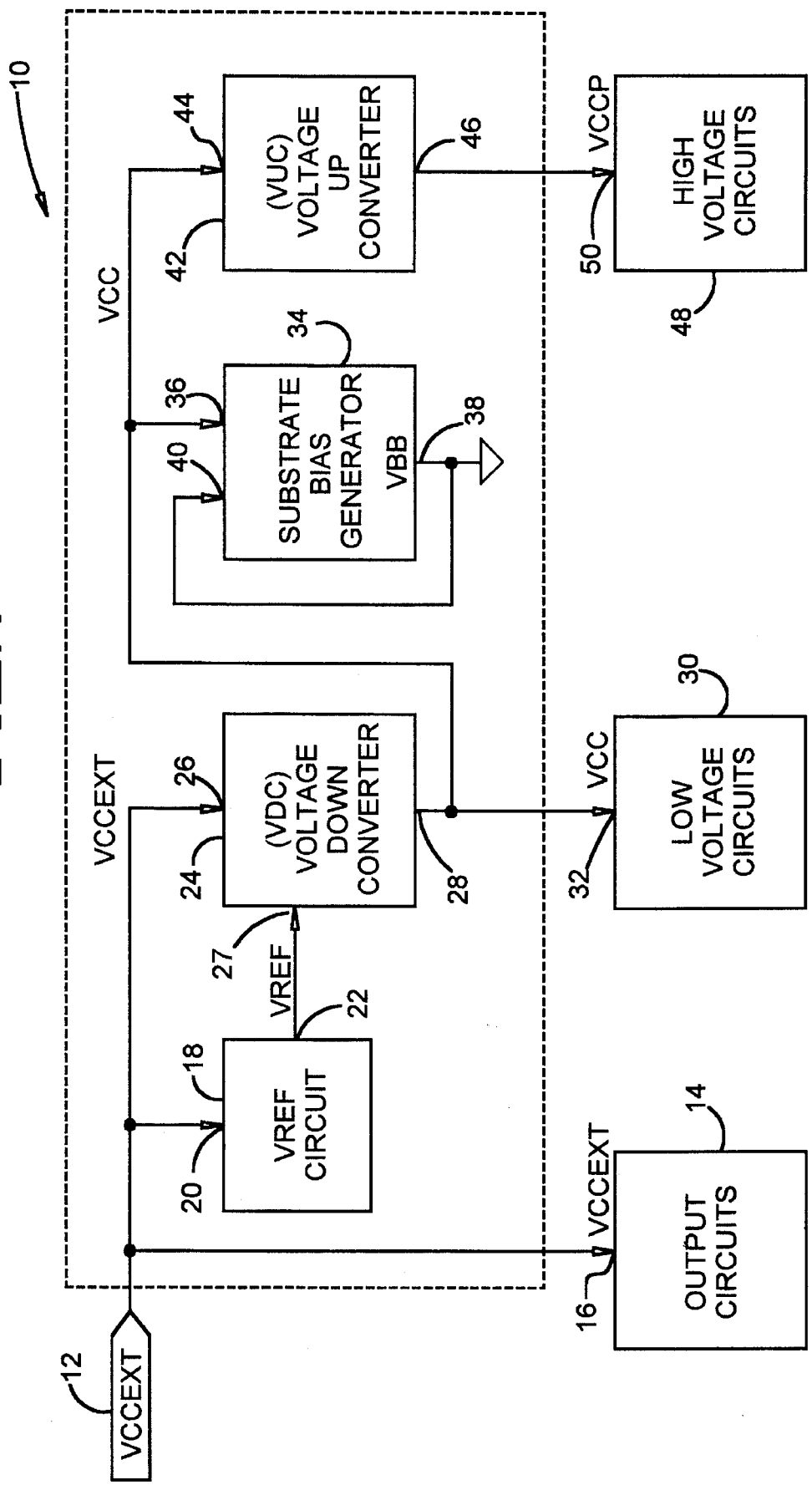
FIG. 1 is a block diagram of the first embodiment of the wide range power supply for integrated circuits where the power supply can operate within a wide range of input supply voltages to provide a low voltage internal supply signal and a high voltage internal supply signal.
Figure 2:
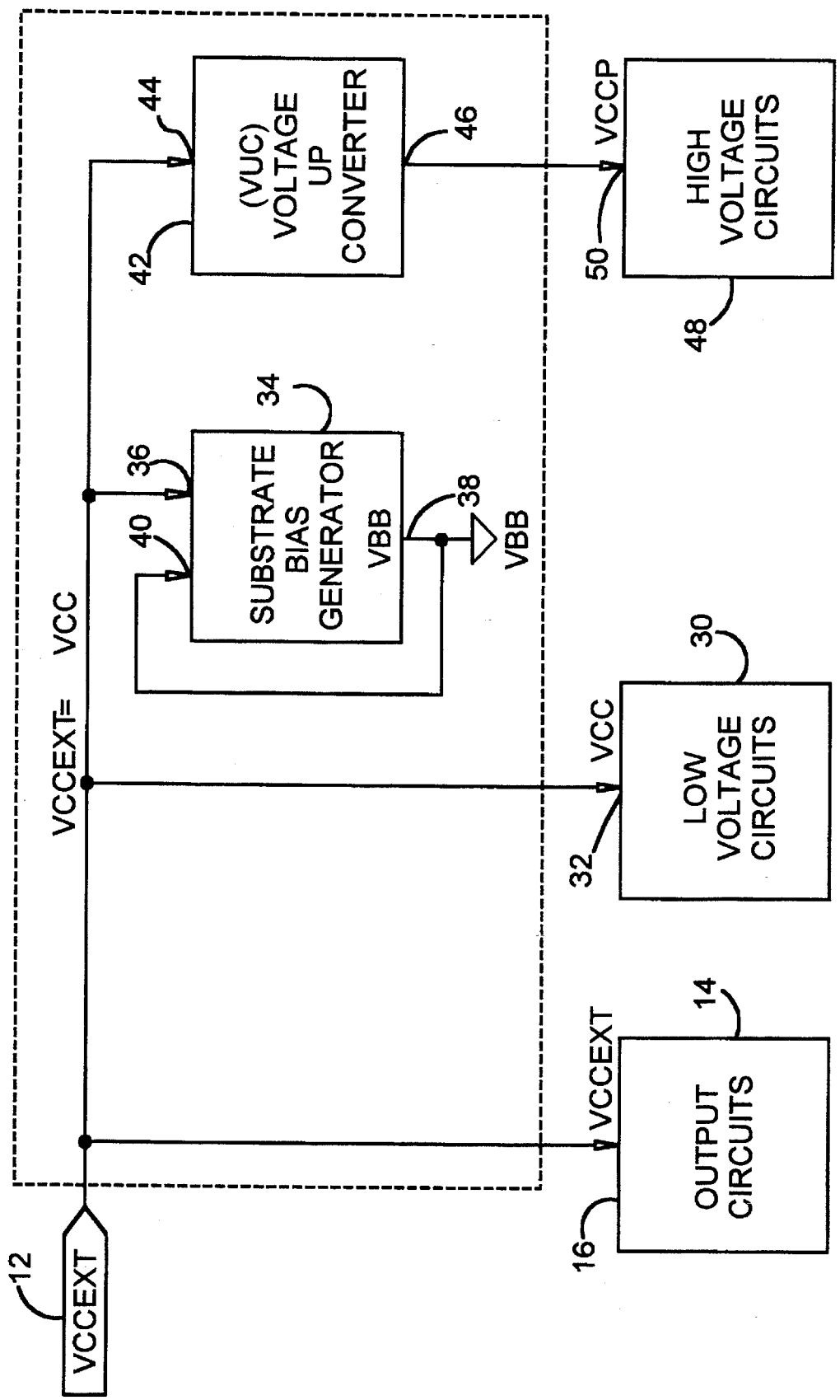
FIG. 2 is a block diagram of an alternate embodiment of the wide range power supply for integrated circuits preferably used with a low voltage input supply.
Figure 3:
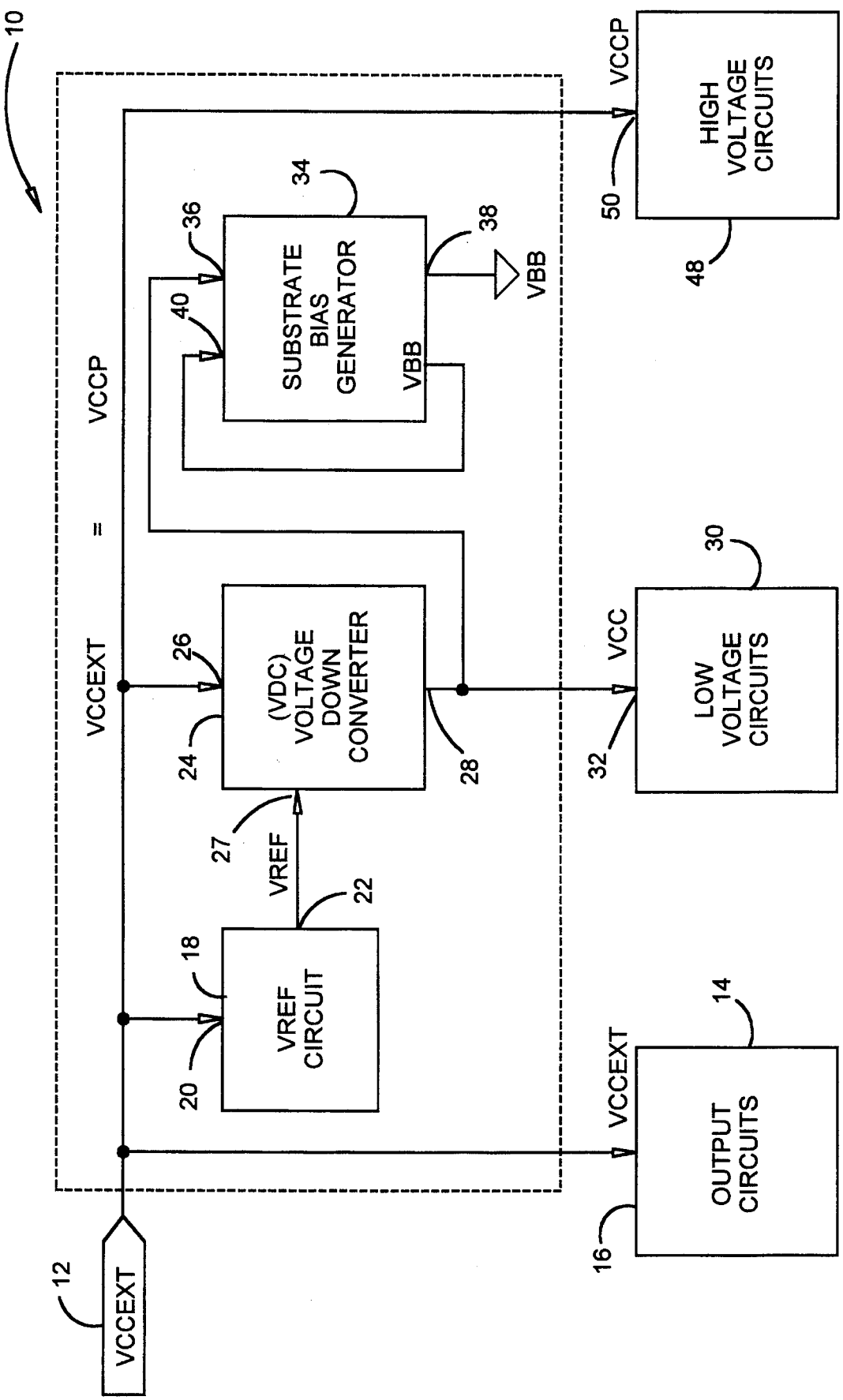
FIG. 3 is a block diagram of an alternate embodiment of the wide range power supply for integrated circuits preferably used with a high voltage input supply.

Appendix B is a copy of U.S. application Ser. No. 07/964,912 filed Oct. 22, 1992, also commonly assigned to the assignees of the present invention. This application discloses the preferred substrate bias generator 34 (as shown in FIG. 1–3) which could be employed in the circuit. The entire text of Appendix B is incorporated in the original disclosure of the present application. A more clear set of drawings has been substituted for the hand sketched drawings originally filed.

Application Ser. No. 07/964,912 has matured into U.S. Pat. No. 5,347,172 issued Sep. 13, 1994.

Appendix C is a copy of U.S. application Ser. No. 08/003,028, filed Jan. 11, 1993 (attorney ref. no. UM-118), which is commonly assigned to the assignees of the present invention. The entire text of Appendix C is incorporated in the original disclosure of the present invention and is directed to the preferred voltage-up converter 42 shown in the block diagrams of FIGS. 1 and 2.

Application Ser. No. 08/003,028 has matured into U.S. Pat. No. 5,337,284 issued Aug. 9, 1994.

DESCRIPTION OF THE PREFERRED EMBODIMENTS

Turning first to FIG. 1, a first embodiment of the wide range power supply for integrated circuits 10 is disclosed in the block diagram of FIG. 1 for receiving an input supply voltage therein called VCCEXT. That input voltage may be the voltage from the power supply pin. Circuit 10 generates therefrom a low voltage signal and a high voltage signal to drive separate low voltage and high voltage circuits, respectively. Specifically, the input supply voltage VCCEXT is coupled to the power supply circuit 10 at an input 12 and may be coupled also to various output circuits 14 at an input 16, if required to drive such output circuits. The input voltage VCCEXT is coupled also to a reference voltage circuit 18 at an input 20. Reference voltage circuit 18 generates an output VREF at an output 22. Reference voltage generator circuits are well known in the art, and any suitable reference voltage generator circuit could be used.

A voltage-down converter 24 receives VCCEXT at an input 26 and VREF at an input 27. Voltage-down converter 24 generates an output signal VCC at an output 28. Preferably, VCC is approximately 3.3 volts, although other values for VCC are possible.

The preferred voltage-down converter 24 is disclosed in Appendix A. The application included in Appendix A discloses a fuse-programmable, voltage-down converter that generates an internal voltage VCC (referred to as VCCINT in Appendix A). The voltage-down converter can be configured to maintain an optimal internal voltage.

Generally, the output VCC generated by the voltage-down converter is controlled and is constant despite variations in VCCEXT. While VCCEXT can vary from 3.0 volts to 5.5 volts, the preferred circuit 24 will nevertheless generate a 3.3 volt VCC (or some other constant value). The controlled VCC signal is input to low voltage circuits 30 at an input 32, if required to drive such output circuits.

VCC is also input to a substrate bias generator 34 at an input 36. The substrate bias generator outputs a signal VBB at an output 38 to maintain the voltage at the substrate. The signal VBB is also fed back to an input 40 of the substrate bias generator to maintain VBB. Preferably VBB is maintained at approximately $-[2/3]$VCC.

An example of a substrate bias generator which could be employed is disclosed in Appendix B. The oscillatorless substrate bias generator of Appendix B maintains the voltage level on the substrate of an integrated circuit.

A voltage-up converter 42 also receives the controlled VCC signal at an input 44. The voltage-up converter generates at an output 46 an output signal VCCP the absolute value of which is generally greater than that of VCC. Because VCC is controlled, it is possible to generate a controlled VCCP output signal. The VCCP signal can be used to power high voltage circuits 48 (i.e. circuits requiring a voltage of 5 volts or more) at an input 50. The preferred voltage-up converter 42 is shown in Appendix C. However, other voltage-up converters which generate a voltage VCCP which is greater than VCC could be used within the scope of the present invention.

Thus, in broad terms, the circuitry of FIG. 1 receives a voltage VCCEXT and from it generates a reference voltage VREF. Thus, VCCEXT and VREF are combined to produce a "low" supply voltage VCC (VCCINT), which is an output signal. Additionally, the generated VCC is used to generate a high supply voltage VCCP, which is a second output signal.

FIG. 2 shows a second embodiment of a wide range power supply for integrated circuits. The second embodiment is preferably used with an input supply voltage which is generally low, approximately 3.0 to 3.6 volts. Accordingly, a reference voltage circuit 18 and a voltage-down converter 24 (shown in FIG. 1) are not required. VCCEXT is used to drive output circuits 14 requiring a low voltage supply. Also, VCCEXT is used as the VCC signal which is input to low voltage circuits 30 at an input 32.

As in the embodiment of FIG. 1, a substrate bias generator 34 receives VCC and VBB signals at inputs 36 and 40 respectively to output a VBB voltage to maintain the voltage at the substrate. Also, a voltage-up converter 42 receives VCC at an input 44. Converter 42 generates a VCCP signal, preferably a 5.0 volt signal, at an output 46. The VCCP signal is used to drive the high voltage circuits 48 at input 50 or could be output to drive output circuits requiring a high voltage supply signal.

The embodiment of FIG. 2 is based upon the embodiment of FIG. 1. However, VCCREF and the voltage-down converter are disabled. It is possible to manufacture the embodiment of FIG. 2 by changing only a single metal mask used in the production of the embodiment of FIG. 1. For example, such disabling can occur by disconnecting input 20 of reference voltage circuit 18 from VCCEXT, disconnecting input 26 of voltage down converter 24 from VCCEXT and connecting VCCEXT to output 28 of voltage down converter 24. Accordingly, a simplified circuit which will draw less current than the circuit of FIG. 1 can be employed when the VCCEXT is controlled and generally a low voltage, for example, between 3.0 and 3.6 volts.

FIG. 3 illustrates an alternate embodiment of the present invention, this embodiment being generally directed to a circuit for receiving a high voltage input supply signal, for example between 4.5 and 5.5 volts. The wide range power supply for integrated circuits of FIG. 3 receives VCCEXT at an input 12. VCCEXT is used to drive the output circuits 14 requiring a high voltage supply signal at input 16. Because VCCEXT is generally a controlled high voltage, it is used to drive the high voltage circuits 48 at input 50.

A VREF circuit 18 receives VCCEXT at an input 20 and generates from it a reference voltage VREF at an output 22. A voltage-down converter 24 receives the VCCEXT at an input 26 and reference voltage VREF at an input 27. The voltage-down converter generates a VCC of approximately 3.3 volts at an output 28. The VCC signal is used to drive the low voltage circuits 30 at an input 32. Also, VCC is input to the substrate bias generator 34 at an input 36 to maintain the voltage at the substrate.

The embodiment of FIG. 3 is similar to the embodiment of FIG. 1 except that the voltage-up converter 42 (shown in FIG. 1 ) is disabled. The embodiment of FIG. 3 also may be manufactured based on the embodiment of FIG. 1 with the change in only one mask layer. Accordingly, if VCCEXT is known to be a high voltage, the embodiment of FIG. 3 can be easily manufactured by disabling the voltage-up converter. As a result, the embodiment of FIG. 3 will generally draw less current than the embodiment of FIG. 1.

FIG. 4 graphically illustrates VCC, VCCP and VBB as a function of the voltage VCCEXT. For example, in the first embodiment, when VCCEXT varies between approximately 3.0 volts and 5.5 volts, it is possible to generate a VCC which is constant (approximately 3.3 volts) and a VCCP which is also constant (approximately 5.0 volts). If VCCEXT is controlled and low (approximately 3.3 volts), the voltage-down converter is not necessary and VCC equals VCCEXT (as disclosed in the embodiment of FIG. 2). However, the embodiment of FIG. 2 includes a voltage-up converter to generate a VCCP of approximately 5 volts. Similarly, as disclosed in the embodiment of FIG. 3, if VCCEXT is high (approximately 5.0 volts), VCCP equals VCCEXT and is maintained at approximately 5.0 volts, while a voltage-down converter generates a VCC of approximately 3.3 volts.

To recapitulate, the circuit of the present invention is adaptable to receive a wide range of input supply voltages (for example between 3.0 and 5.5 volts) and to generate separate low voltage and high voltage signals to drive separate low voltage and high voltage circuits within an integrated circuit device. Preferably, the low voltage signal VCC is approximately 3.3 volts. Because the internal low voltage signal is controlled, it is independent of variations in the input supply voltage and can be used to generate other internal voltages, such as a high voltage VCCP. Preferably, the high voltage is approximately 5.0 volts. However, the circuits can be designed to generate other low and high voltage signals. Finally, a substrate bias generator may be included to maintain the voltage at the substrate of the semiconductor device.

Although the circuits disclosed in the appendices are preferred circuits which could be employed in the invention, other circuits could be used. While this invention has been described with reference to an illustrative embodiment, it will be understood that this description is not intended to be construed in a limiting sense, but is intended to include any substitutes within the scope of the invention. Various modifications of the illustrative embodiment, as well as other embodiments, will become apparent to those skilled in the art upon reference to this description. The invention is intended to be set forth in the following claims.

We claim:

1. In an integrated circuit, a power supply circuit for receiving a supply voltage applied to the integrated circuit and for providing at least first and second supply voltages for use by other circuits on said integrated circuit, and a substrate bias voltage for biasing the substrate of the integrated circuit, comprising:

an input coupled to receive the supply voltage;

a reference generator circuit coupled to receive said supply voltage from said input and to generate a reference voltage;

a first voltage converter circuit having a first input coupled to receive said reference voltage from said reference generator circuit, a second input coupled to receive said supply voltage, and a first output, the first converter circuit generating a first output voltage at said first output, said first output being substantially independent of variations in said supply voltage;

a second voltage converter circuit having an input coupled to receive said first output voltage and having a second output, said second converter circuit generating a second output voltage at said second output; and a substrate bias generator circuit having an input coupled to receive said first output voltage to generate a negative voltage for biasing a substrate of the integrated circuit.

2. The power supply circuit in an integrated circuit of claim 1 wherein said supply voltage is between 3.0 and 5.5 volts.

3. The power supply circuit in an integrated circuit of claim 1 wherein the first voltage converter circuit is a voltage-down converter for generating said first output voltage for use by low voltage circuits of the integrated circuit.

4. The power supply circuit for an integrated circuit of claim 3 wherein said first output voltage is between approximately 3.0 and 3.6 volts.

5. The power supply circuit in an integrated circuit of claim 1 wherein said substrate bias generator is an oscillatorless substrate bias generator.

6. The power supply circuit in an integrated circuit of claim 1 wherein the second voltage converter circuit is a voltage-up converter.

7. The power supply circuit in an integrated circuit of claim 6 wherein the output of said voltage-up converter is between approximately 4.5 and 5.5 volts for use by high voltage circuits of the integrated circuit.

8. In an integrated circuit, a power supply circuit for receiving a wide range supply voltage applied to the integrated circuit, said power supply circuit comprising:

an input coupled to receive the supply voltage;

a reference generator circuit coupled to receive said wide range supply voltage and generate a reference voltage;

a voltage-down converter having a first input coupled to receive said reference voltage from said reference generator circuit, a second input coupled to receive said supply voltage, and a low voltage output for outputting a low voltage for use by a low voltage circuit on said integrated circuit, said low voltage output being substantially independent of variations in said supply voltage over a range of voltage;

a voltage-up converter having an input coupled to receive the low voltage from said low voltage output, said voltage-up converter circuit generating a high voltage output for use by a high voltage circuit on the integrated circuit; and a substrate bias generator circuit having an input coupled to receive said low voltage from said low voltage output and to generate a substrate bias voltage to maintain a negative voltage on a substrate of the integrated circuit.

9. The power supply circuit in an integrated circuit of claim 8 wherein said wide range supply voltage is between 3.0 and 5.5 volts.

10. The power supply circuit for an integrated circuit of claim 8 wherein said low voltage output is between approximately 3.0 and 3.6 volts.

11. The power supply circuit in an integrated circuit of claim 8 wherein the high voltage output of said voltage-up converter is between approximately 4.5 and 5.5 volts.

12. A power supply circuit in an integrated circuit including:

a reference generator circuit coupled to receive a supply voltage and generate a reference voltage, a first converter circuit comprising a voltage-down converter having a first input coupled to receive said reference voltage from said reference generator circuit, a second input coupled to receive said supply voltage, and an output for generating a first output signal, said first output signal being substantially independent of variations in said supply voltage, said first converter circuit providing power to a low voltage circuit having an input for receiving said first output signal, a second converter circuit comprising a voltage-up converter coupled to receive the output of said first converter circuit, said second converter circuit generating a second output signal, said second converter circuit being adapted to be coupled to a high voltage circuit including an input for receiving said second output signal, wherein said reference generator circuit is adapted to receive a wide range of external supply voltages and wherein substantially all of the low voltage circuits or high voltage circuits of the integrated circuit are coupled to be powered by said first or second output signals.

13. The power supply circuit for an integrated circuit of claim 12 further including a substrate bias generator which includes a low current self-timed clock circuit which is not free running and is responsive to an active clock enabling signal, a pump circuit to pump charge and to lower the voltage of the substrate of said integrated circuit, and wherein the self-timed clock circuit ignores the clock enabling signal until after the completion of the pumping.

14. The power supply circuit for an integrated circuit of claim 12 wherein the voltage down converter circuit is programmable to provide a voltage over a range of outputs.

15. The power supply circuit for an integrated circuit of claim 14 wherein the voltage down converter circuit includes a counter for setting the first output signal during a test stage and fuse circuitry for permanently setting the first output signal.

16. The power supply circuit for an integrated circuit of claim 12 wherein the voltage up converter includes a low-power standby pump circuit coupled to monitor said high voltage and pump charge to maintain said high voltage, and an active pump circuit coupled to pump charge to maintain said high voltage during active cycles.

17. The voltage generator of claim 16 wherein the standby pump circuit includes a self-timed clock circuit.

18. The voltage generator of claim 16 wherein the standby pump in the voltage up converter is always active.

19. The said power supply circuit of claim 12 further characterized by a substrate bias generator circuit coupled to receive said first output signal and generate a substrate bias signal to maintain the voltage at the substrate of the integrated circuit.

20. The power supply circuit for an integrated circuit of claim 12 wherein said wide range supply voltage is between 3.0 and 5.5 volts.

21. The power supply circuit for an integrated circuit of claim 12 wherein said first output signal is between approximately 3.0 and 3.6 volts.

22. The power supply circuit for an integrated circuit of claim 12 wherein said second output signal is between approximately 4.5 and 5.5 volts.

23. The power supply circuit for an integrated circuit of claim 12 further including a substrate bias generator.

24. The power supply circuit for an integrated circuit of claim 23 wherein the substrate bias generator includes a self-timed clock circuit and a voltage regulator circuit coupled to a substrate of said integrated circuit for monitoring a substrate voltage.

25. The power supply circuit of claim 24 wherein the voltage regulator circuit outputs a clock enabling signal when the voltage varies from a predetermined level, and wherein the self-timed clock circuit is responsive to the clock enabling signal for generating clock signals when receiving the clock enabling signal.

26. The power supply circuit of claim 24 wherein the substrate bias generator further includes a two-stage pump circuit responsive to the clock signals for pumping charge to the substrate to alter the voltage at the substrate.

27. The power supply circuit of claim 24 wherein the voltage regulator circuit is a low-power regulator that is always active.

\* \* \* \* \*